United States Patent
Lin et al.

(10) Patent No.: US 11,597,999 B2
(45) Date of Patent: Mar. 7, 2023

(54) METHOD AND DEVICE FOR DECREASING GENERATION OF SURFACE OXIDE OF ALUMINUM NITRIDE

(71) Applicant: SKY TECH INC., Zhubei (TW)

(72) Inventors: Jing-Cheng Lin, Zhubei (TW); Yao-Syuan Cheng, Zhubei (TW)

(73) Assignee: SKY TECH INC., Hsinchu County (TW)

( * ) Notice: Subject to any disclaimer, the term of this patent is extended or adjusted under 35 U.S.C. 154(b) by 399 days.

(21) Appl. No.: 16/798,847

(22) Filed: Feb. 24, 2020

(65) Prior Publication Data

US 2021/0262082 A1   Aug. 26, 2021

(51) Int. Cl.
| | |
|---|---|
| *C23C 14/56* | (2006.01) |
| *C23C 14/54* | (2006.01) |
| *C23C 14/06* | (2006.01) |
| *H01L 21/02* | (2006.01) |

(52) U.S. Cl.
CPC ........ *C23C 14/566* (2013.01); *C23C 14/0641* (2013.01); *C23C 14/541* (2013.01); *H01L 21/02318* (2013.01)

(58) Field of Classification Search
CPC ... C23C 14/541; C23C 14/566; C23C 14/568; H01L 21/02318; H01L 21/67184; H01L 43/12
See application file for complete search history.

(56) References Cited

U.S. PATENT DOCUMENTS

| | | | | |
|---|---|---|---|---|
| 9,870,964 | B1* | 1/2018 | Yoshino | H01L 21/0228 |
| 2007/0048451 | A1* | 3/2007 | White | C23C 14/568 |
| | | | | 427/124 |
| 2011/0097878 | A1* | 4/2011 | Olgado | C23C 16/4587 |
| | | | | 118/723 AN |
| 2011/0253037 | A1* | 10/2011 | Tsunekawa | H01L 21/67115 |
| | | | | 392/416 |
| 2020/0403152 | A1* | 12/2020 | Xue | H01F 10/325 |

* cited by examiner

*Primary Examiner* — Jaehwan Oh
(74) *Attorney, Agent, or Firm* — Chun-Ming Shih; HDLS IPR Services

(57) ABSTRACT

The present disclosure relates to a method and device for decreasing generation of surface oxide of aluminum nitride. In a physical vapor deposition process, the aluminum nitride is deposited on a substrate in a deposition chamber to form an aluminum nitride coated substrate. A cooling chamber and a cooling load lock module respectively perform a first stage cooling and a second stage cooling on the aluminum nitride coated substrate in vacuum environments, so as to prevent the aluminum nitride coated substrate with the high temperature from being exposed in an atmosphere environment to generate the surface oxide. The method and device for decreasing the generation of the surface oxide of the aluminum nitride can further eliminate crystal defects caused by that gallium nitride is deposited on the surface oxide of the aluminum nitride in the next process.

5 Claims, 9 Drawing Sheets

HP206

(the related art)

(the present disclosure)

METHOD AND DEVICE FOR DECREASING GENERATION OF SURFACE OXIDE OF ALUMINUM NITRIDE

TECHNICAL FIELD

The present disclosure relates to a method and device for decreasing generation of surface oxide of aluminum nitride, in particular to, a method and device which are capable of decreasing the generation of the surface oxide of the aluminum nitride in a physical vapor deposition (PVD) process, so as to eliminate crystal defects caused by that gallium nitride stacks on the surface oxide of the aluminum nitride in the next process.

RELATED ART

In alight emitting diode (LED) manufacturing process, luminescent material "gallium nitride (GaN)" must be coated on a substrate. The substrate generally is selected from a sapphire, and the sapphire has crystals of aluminum oxide ($Al_2O_3$). Since a crystalline size of the gallium nitride is far different from that of the aluminum oxide, it has a mismatch problem if stacking them directly. Thus, a problem of dislocation cannot be avoided, and a lighting efficiency of the LED is decreased.

Generally, to solve the above problems, one layer of aluminum nitride (AlN), as a buffer material, is inserted between the gallium nitride and the aluminum oxide. A crystalline size of the aluminum nitride falls within a range between the crystalline sizes of the gallium nitride and the aluminum oxide, and it results a good stacking efficiency. Therefore, defects between the gallium nitride and the sapphire can be eliminated, and the lighting efficiency of the LED is enhanced.

Accordingly, in the currently used LED manufacturing process, the aluminum nitride is firstly coated on the substrate of the aluminum oxide, and the gallium nitride is next coated on the aluminum nitride. However, after the aluminum nitride is coated on the substrate of the aluminum oxide, there still are defects caused by stacking the gallium nitride, which affect the lighting efficiency, wavelength and lifetime of the LED. Since surface oxide is usually generated on a surface of the aluminum nitride, the gallium nitride in fact is stacked on the surface oxide of the aluminum nitride, but not on the aluminum nitride, and that is, the stack defects of the gallium nitride are generated because the gallium nitride is stacked on the incorrect target.

SUMMARY

To solve deficiency of the related art, embodiments the present disclosure provide a method and device for decreasing generation of surface oxide of aluminum nitride. After the aluminum nitride is deposited on a substrate, a cooling chamber and a cooling load lock module respectively perform a first stage cooling and a second stage cooling on an aluminum nitride coated substrate in different vacuum environments, so as to prevent the aluminum nitride coated substrate with a high temperature from being exposed in an atmosphere environment to generate the surface oxide. Thus, in the next process, gallium nitride to be deposited can be stacked on a correct target, the stack defects of the gallium nitride can be eliminated, and the lighting efficiency of the LED can be enhanced.

To achieve one of the above objectives, an embodiment of the present disclosure provides a method for decreasing generation of surface oxide of aluminum nitride. The method for decreasing the generation of the surface oxide of the aluminum nitride can be used in a physical vapor deposition (PVD) process and at least comprise the following steps: step A, depositing the aluminum nitride on a substrate in a first vacuum environment, so as to form an aluminum nitride coated substrate; step B, performing a first stage cooling on the aluminum nitride coated substrate in a second vacuum environment; and step C, performing a second stage cooling on the aluminum nitride coated substrate in a third vacuum environment; wherein a pressure of the second vacuum environment is less than a pressure of the third vacuum environment.

In accordance with one embodiment of the present disclosure, in step B, the first stage cooling comprises at least one of a contact cooling, a quiescence cooling and a gas cooling.

In accordance with one embodiment of the present disclosure, when the first stage cooling comprises the gas cooling, gas for cooling is inert gas.

In accordance with one embodiment of the present disclosure, in step B, a cooling chamber for performing the first stage cooling on the aluminum nitride coated substrate has a cooling temperature of 150-250° C.

In accordance with one embodiment of the present disclosure, in step C, a cooling load lock module for performing the second stage cooling on the aluminum nitride coated substrate has a cooling temperature being less than 100° C.

To achieve one of the above objectives, an embodiment of the present disclosure provides a device for decreasing generation of surface oxide of aluminum nitride. The device for decreasing the generation of the surface oxide of the aluminum nitride can be used in a PVD process and comprise: a degas load lock module, for providing a vacuum environment to at least one substrate; at least one deposition chamber, for depositing the aluminum nitride on the at least one substrate, so as to form at least one aluminum nitride coated substrate; a cooling chamber, for performing a first stage cooling on the at least one aluminum nitride coated substrate; and a cooling load lock module, for performing a second stage cooling on the at least one aluminum nitride coated substrate.

In accordance with one embodiment of the present disclosure, the cooling chamber comprises: at least one tray, for supporting and contacting the at least one aluminum nitride coated substrate, so as to perform the first stage cooling; and at least one cooling base, for providing inert gas to a back surface of the tray, so as to cool down the at least one tray.

In accordance with one embodiment of the present disclosure, the cooling chamber comprises: a slot base, having slots, for receiving the at least one aluminum nitride coated substrate, so as to perform the first stage cooling.

In accordance with one embodiment of the present disclosure, each of the slots has spacing pads, and the spacing pads are used to decrease an contact area of the aluminum nitride coated substrate and the slot, and to buffer a temperature which applied to the aluminum nitride coated substrate for cooling.

In accordance with one embodiment of the present disclosure, The device for decreasing the generation of the surface oxide of the aluminum nitride can further comprise: at least one load port module, used to be disposed with a load box which loads the least one substrate; and an equipment front end module, having an aligner which is used to align a notch of the least one substrate.

In short, the method and device for decreasing the generation of the surface oxide of the aluminum nitride of the present disclosure can efficiently decrease the generation of the surface oxide of the aluminum nitride, such that the gallium nitride in the next process can be stacked on the correct target "aluminum nitride", but not on the incorrect target "oxide of the aluminum nitride", the stack defects of the gallium nitride can be eliminated, and qualities of products can be raised. The method and device for decreasing the generation of the surface oxide of the aluminum nitride of the present disclosure have potential and advantages in the processes and markets (such as, LED manufacturing process and LED product markets) which need to deposit the aluminum nitride.

In order to make the above and other objectives, features, and advantages of the present disclosure more comprehensible, details of embodiments accompanying with drawings are described below.

BRIEF DESCRIPTIONS OF DRAWINGS

Figure 5:
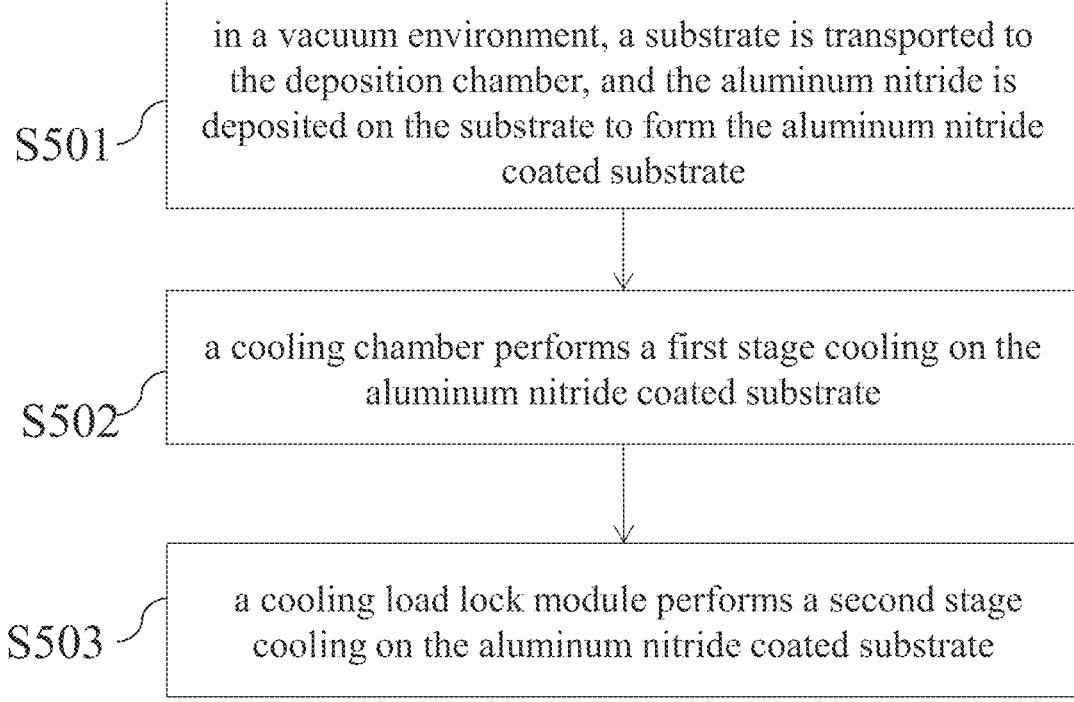

FIG. 5 a flow chart of a method for decreasing generation of surface oxide of aluminum nitride according to an embodiment of the present disclosure.

Figure 6:
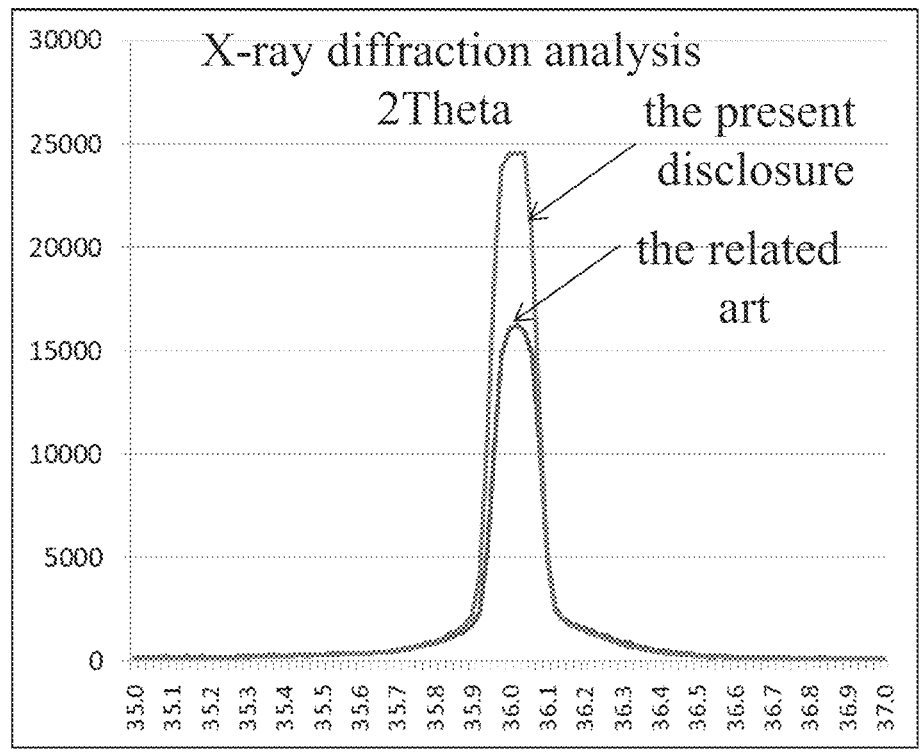
Figure 6:
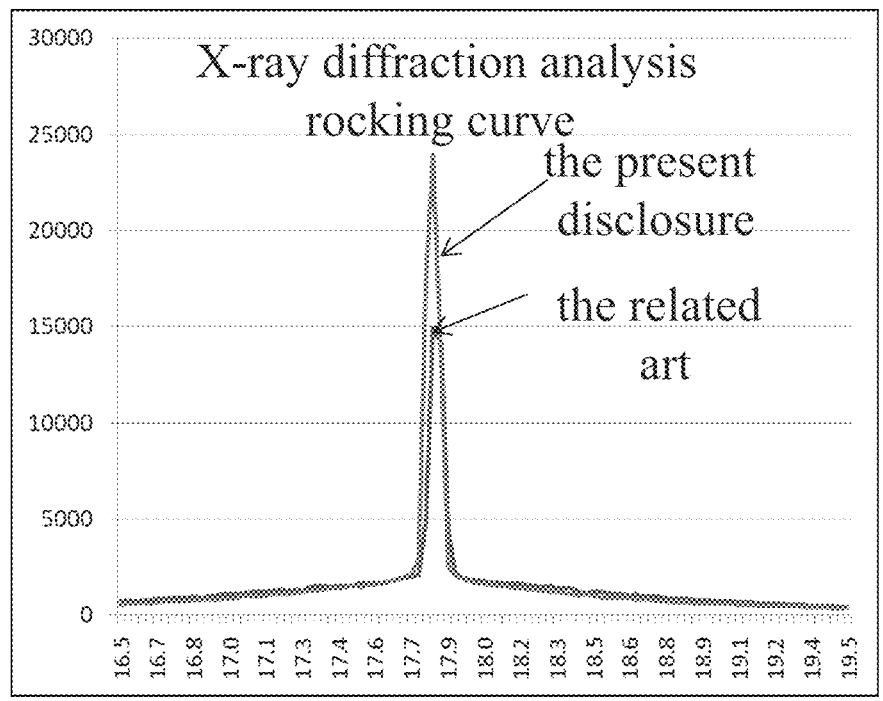

FIG. 6 is an X-ray diffraction analysis chart of crystals of the aluminum nitride according to an embodiment of the present disclosure.

Figure 7:
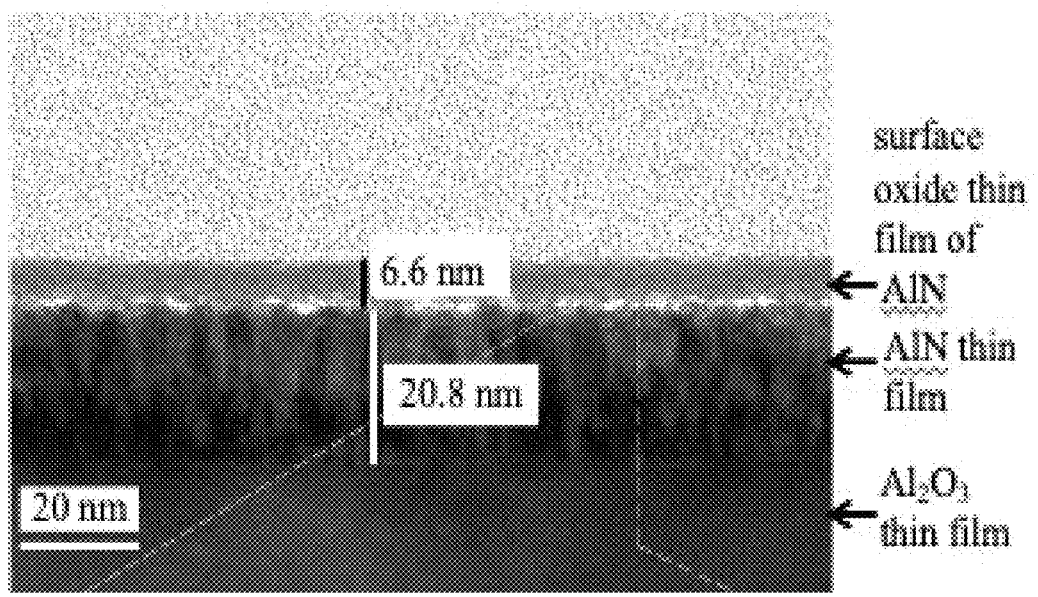
Figure 7:
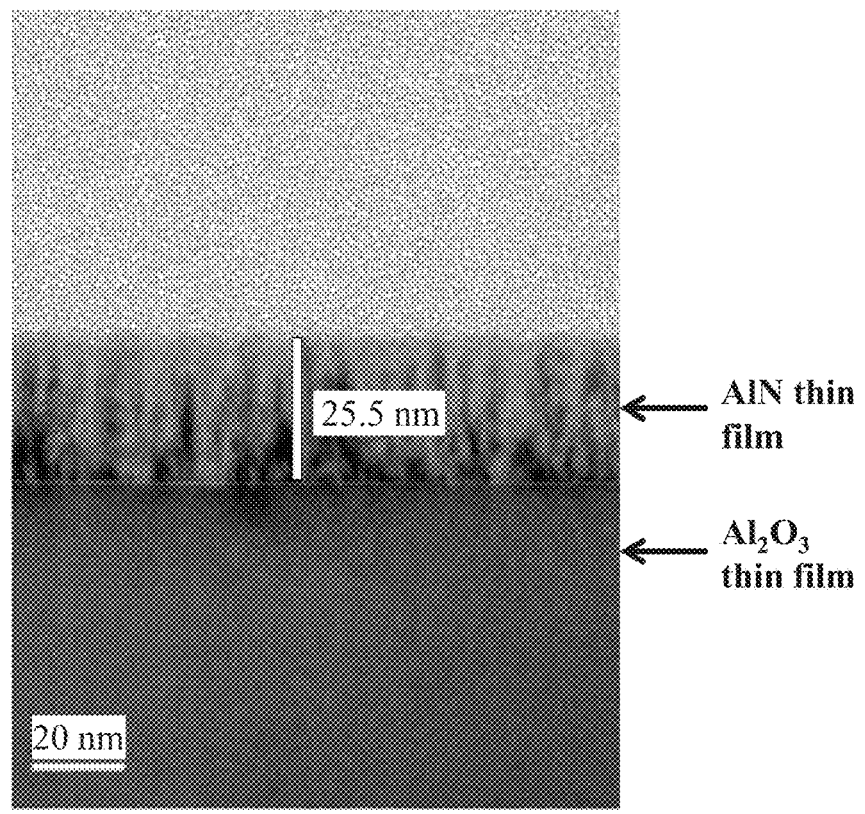

FIG. 7 is a schematic diagram showing two transmission microscope images of the deposition of the LED manufactured by using methods of the related art and the present disclosure.

DETAILS OF EXEMPLARY EMBODIMENTS

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1A:
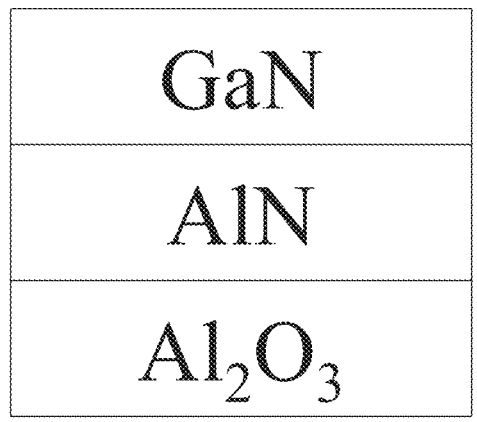
FIG. 1A is a schematic diagram showing an ideal deposition result associated with the LED manufacturing process of the related art.

The present disclosure provides a method and device for decreasing generation of surface oxide of aluminum nitride, which can be used in a LED manufacturing process. In the related art, the deposited aluminum nitride may be oxidized to generate oxide which cause stack defects of gallium nitride. Please refer to FIG. 1A, and FIG. 1A is a schematic diagram showing an ideal deposition result associated with the LED manufacturing process of the related art. As shown in FIG. 1A, in the LED manufacturing process of the related art, buffer material "aluminum nitride" is usually deposited on a sapphire having crystals of aluminum oxide ($Al_2O_3$), and luminescent material "gallium nitride (GaN)" is deposited on the aluminum nitride.

Figure 1B:
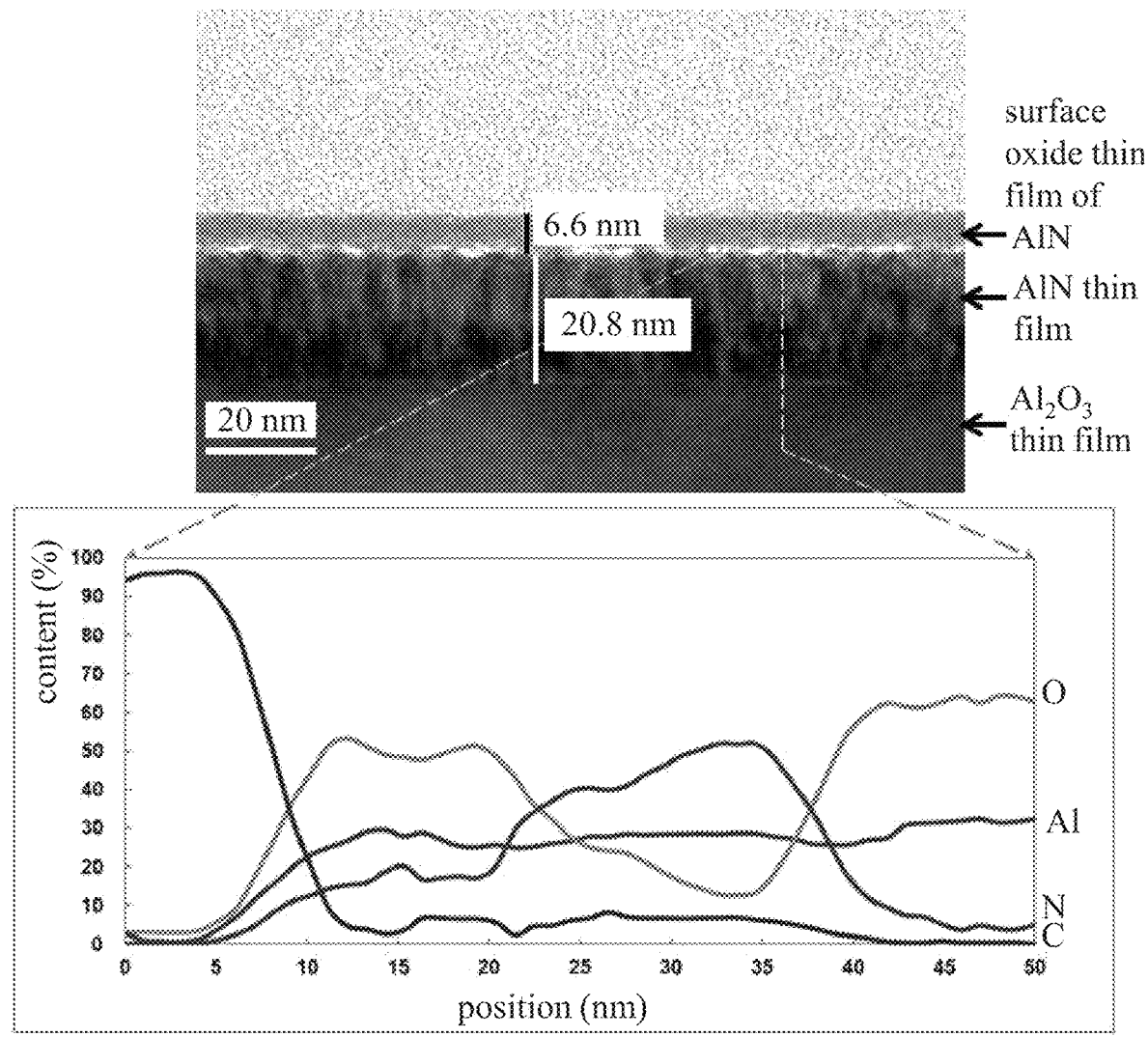
FIG. 1B is a schematic diagram showing a transmission microscope image and an energy dispersive spectroscopy of the deposition of the LED manufactured by the LED manufacturing process of the related art.

In a PVD process, after depositing the aluminum nitride on the sapphire (aluminum oxide), a substrate (i.e. sapphire) which surface is deposited with the aluminum nitride is generally transported into an atmosphere environment for cooling. However, if the aluminum nitride with the high temperature is exposed to the atmosphere environment, the surface of the aluminum nitride may be oxidized, and thus one layer of surface oxide of the aluminum nitride may be formed. Please refer to FIG. 1B, and FIG. 1B is a schematic diagram showing a transmission microscope image and an energy dispersive spectroscopy of the deposition of the LED manufactured by the LED manufacturing process of the related art. As shown in FIG. 1B, the practical results show that a thin film of the of the surface oxide of the aluminum nitride is formed on a thin film of the aluminum nitride, wherein the thin film of the aluminum nitride has a thickness of about 20.8 nm, the thin film of the of the surface oxide of the aluminum nitride has a thickness of about 6.6 nm, and the above thickness are not used to limit the present disclosure. The layer of the oxide will affect the next process, and the gallium nitride which is intended to be stacked on aluminum nitride in fact is stacked on the oxide of the aluminum nitride. The oxide further affects a crystallization direction and crystallinity of depositing the gallium nitride, which causes stack defects of the gallium nitride, decreases the lighting efficiency and lifetime of the LED, and affects the expected wavelength of the LED. Thus, in the embodiments of the present disclosure, a method and device are provided to decrease the generation of the surface oxide of the aluminum nitride, so as to enhance the lighting efficiency, lifetime and wavelength deviation of the LED.

Figure 2:
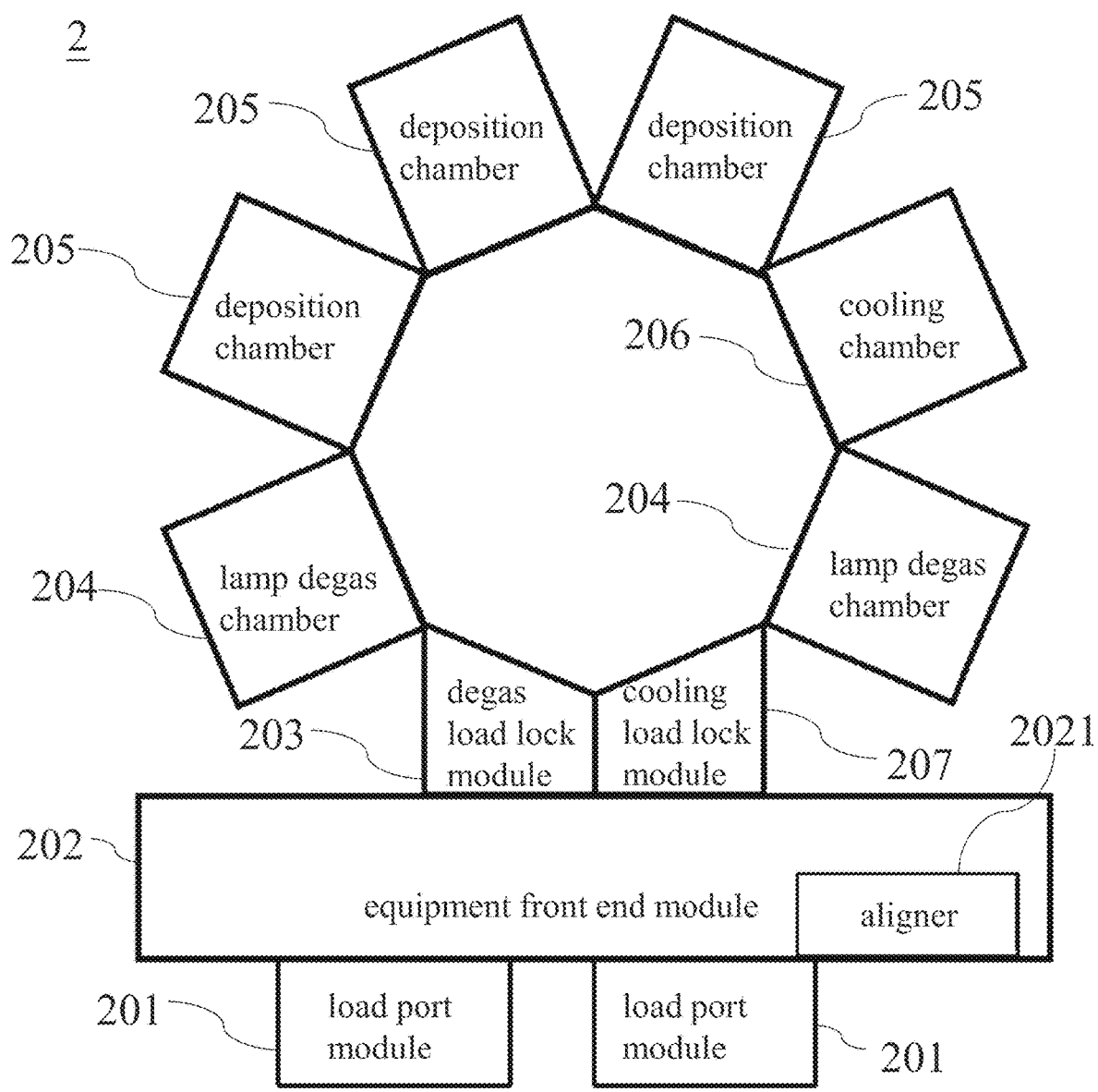
FIG. 2 is a schematic diagram showing a device for decreasing generation of surface oxide of aluminum nitride, acted as a physical vapor deposition device, according to an embodiment of the present disclosure.

Firstly, referring to FIG. 2, FIG. 2 is a schematic diagram showing a device for decreasing generation of surface oxide of aluminum nitride, acted as a physical vapor deposition device, according to an embodiment of the present disclosure. As shown in FIG. 2, in the PVD process, the device 2 for decreasing the generation of the surface oxide of the aluminum nitride, acted as the PVD device, comprises two load port modules 201, an equipment front end module 202 with an aligner 2021, a degas load lock module 203, two lamp degas chambers 204, three deposition chambers 205, a cooling chamber 206 and a cooling load lock module 207. Though, there are multiple load port modules 201, lamp degas chambers 204 and deposition chambers 205 in the embodiment, the number of the above modules and chamber are not intended to limit the present disclosure as well as the number of the cooling chamber 206.

When starting to perform the PVD of the aluminum nitride, at least one load box which loads multiple sapphires (substrates of aluminum oxide) is put into the load port module 201 and locked. Next, a door of the load box is opened, and thus the sapphires in the load box are transported to the equipment front end module 202. Though the embodiment is illustrated by taking the substrate of aluminum oxide as an example, the present disclosure does not limit material of the substrate, and other material substrates on which the aluminum nitride is deposited can be also applicable to the present disclosure.

Next, according to a notch of at least one tray which conveys the sapphires, aligner 2012 of the equipment front end module 202 aligns the tray, such that an angle between the sapphires and the tray is adjusted to a target angle. Further, the present disclosure is not limited by the target angle and the existence of the aligner 2012.

Further, the degas load lock module 203 can provide an vacuum environment to the sapphires until the sapphires have been degassed in the lamp degas chamber 204, wherein when providing the vacuum environment to and degassing the sapphires, a vacuum degree (i.e. pressure) of the degas load lock module 203 is not larger than 100 mTorr, and a vacuum degree (i.e. pressure) of the lamp degas chamber 204 is not larger than 50 mTorr, such that it prevents non-targets in atmosphere from falling or being deposited on the sapphires in the next deposition process.

Next, the sapphires in the vacuum environment are transported to the deposition chamber 205, and the aluminum nitride is deposited on the sapphires, wherein the deposition chamber 205 provides a first vacuum environment to the sapphires, and a vacuum degree (i.e. pressure) of the first vacuum environment is not larger than 0.000005 ($5*10^{-6}$) Torr, so as to efficiently perform the deposition. In the process of the deposition, a process temperature is larger than or equal to 300° C., preferably larger than or equal to 350° C., and optimally larger than or equal to 400° C. to have a best aluminum nitride deposition effect. The deposition process can be performed by one of the deposition chambers 205, and the present disclosure does not limit a specific one of the deposition chambers 205.

Specifically, after the aluminum nitride is deposited on the sapphire, an aluminum nitride coated substrate is formed. The aluminum nitride coated substrate is transmitted to the cooling chamber 206, and a first stage cooling is performed on the aluminum nitride coated substrate, wherein the cooling chamber has at least two implementation types as shown in FIG. 3A-FIG. 3C and FIG. 4, which details are illustrated as follows.

Figure 3A:
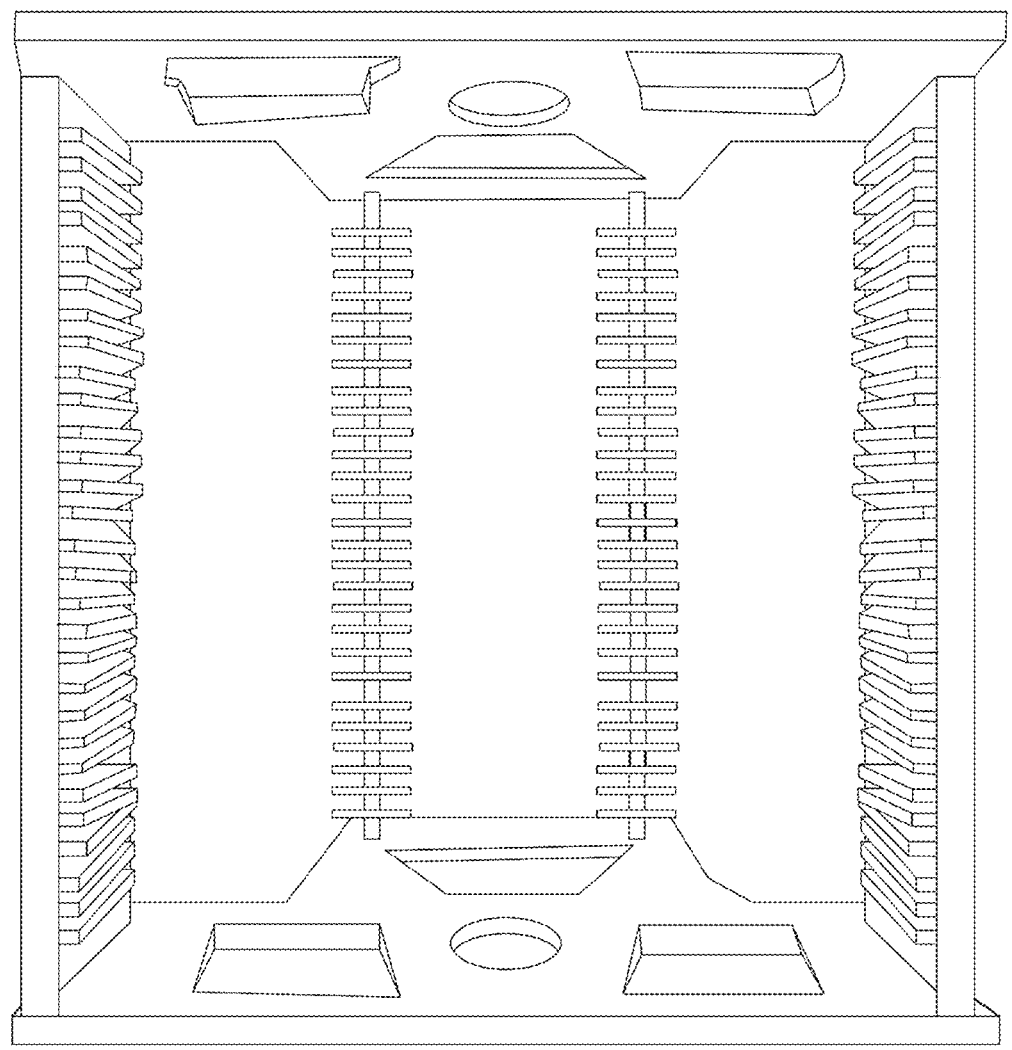
FIG. 3A is a schematic diagram showing a substrate supporter in a cooling chamber of a first type according to an embodiment of the present disclosure.
Figure 3B:
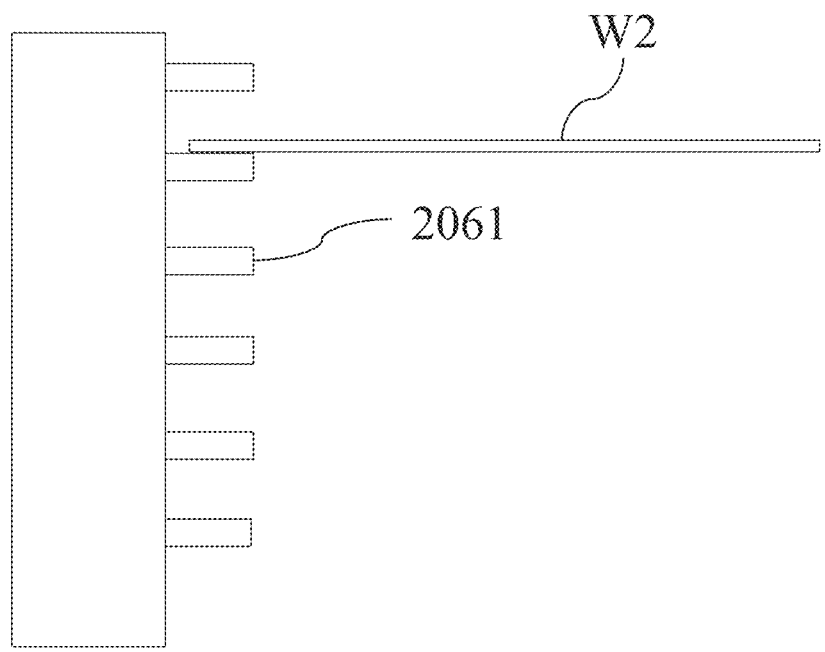
FIG. 3B is a schematic diagram showing interior of a cooling chamber of a first type according to an embodiment of the present disclosure.
Figure 3C:
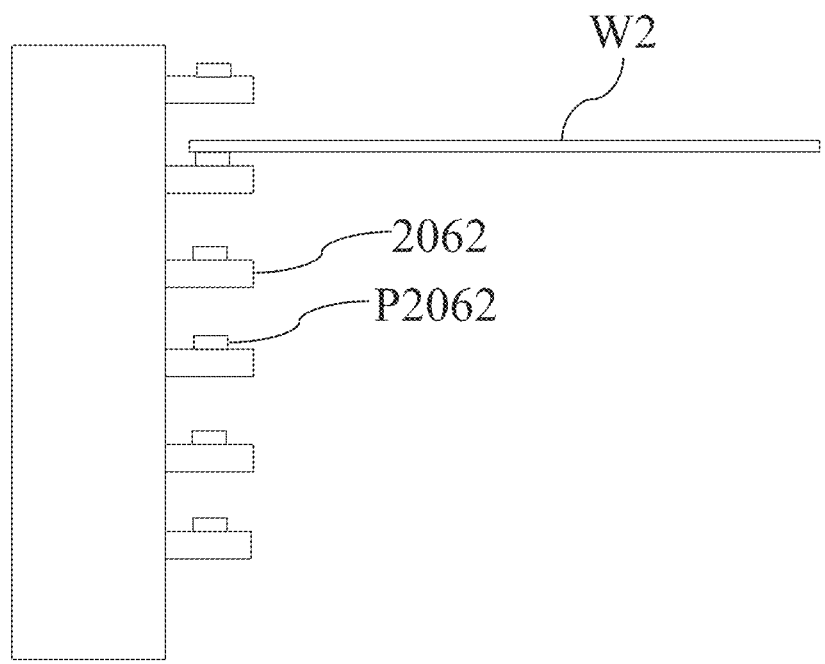
FIG. 3C is a schematic diagram showing interior of a cooling chamber of a first type according to another one embodiment of the present disclosure.

Refer to FIG. 3A-FIG. 3C, FIG. 3A is a schematic diagram showing a substrate supporter in a cooling chamber of a first type according to an embodiment of the present disclosure, FIG. 3B is a schematic diagram showing interior of a cooling chamber of a first type according to an embodiment of the present disclosure, and FIG. 3C is a schematic diagram showing interior of a cooling chamber of a first type according to another one embodiment of the present disclosure. In FIG. 3A, the cooling chamber of the first type has a slot base HP206 therein, and the slot base HP206 has multiple slots arranged along a vertical direction, and the slots are used to receive the aluminum nitride coated substrates, so as to further perform the first stage cooling on the aluminum nitride coated substrates. When the aluminum nitride coated substrates are disposed on the slots, the aluminum nitride coated substrate can be supported by tray or not. One implementation of the slots is shown in FIG. 3B, each of the slots 2061 has no protrusions (such as, spacing pads), and directly supports and contacts the aluminum nitride coated substrate W2, so as to further perform the first stage cooling on the aluminum nitride coated substrate W2. Preferably, the slots can be implemented as shown in FIG. 3C, each of the slots 2062 has spacing pads P2062, and the material of the spacing pad P2062 can be the same as that of the slots, or can be ceramic. By the way, the material and number of the spacing pads P2062 are not intended to limit the present disclosure. The spacing pads P2062 are used to decrease a contact area of the aluminum nitride coated substrate W and the slot 2062, and to buffer a temperature which applied to the aluminum nitride coated substrate W2 for cooling, such that the aluminum nitride coated substrate W2 will not be broken due to its temperature variation.

The first stage cooling of the cooling chamber of the first type as shown in FIG. 3A-FIG. 3C comprises at least one of a contact cooling, a quiescence cooling and a gas cooling. The quiescence cooling is to pour gas one time to cool down the target. When the first stage cooling is the quiescence cooling with one time gas pouring, the gas is poured into the cooling chamber of the first type once, the poured gas can be argon (Ar), helium (He) or nitrogen ($N_2$), and the present disclosure is not limited thereto. When cooling down the aluminum nitride coated substrate W2, the cooling chamber provides a second vacuum environment to the aluminum nitride coated substrate W2. The pressure of the poured gas is 500 mTorr to 500 Torr (preferably 1-3 Torr). When performing the first stage cooling via the cooling chamber of the first type, a pressure in the cooling chamber of the first type (i.e. the pressure of the second vacuum environment) must not be larger than 50 mTorr, and the cooling time is about 2-15 minutes, such that the cooling temperature of the cooling chamber of the first type which performs the first stage cooling can be 150-250° C. Further, when the first stage cooling is the gas cooling, the gas is continuously poured into the cooling chamber of the first type, wherein the poured gas is inert gas, such as argon (Ar), helium (He) or nitrogen ($N_2$), and the present disclosure is not limited thereto. The pressure of the poured gas is 500 mTorr to 500 Torr (preferably 1-3 Torr). When performing the first stage cooling via the cooling chamber of the first type, a pressure in the cooling chamber of the first type (i.e. the pressure of the second vacuum environment) must not be larger than 50 mTorr, and the cooling time is about 2-15 minutes, such that the cooling temperature of the cooling chamber of the first type which performs the first stage cooling can be 150-250° C.

Figure 4:
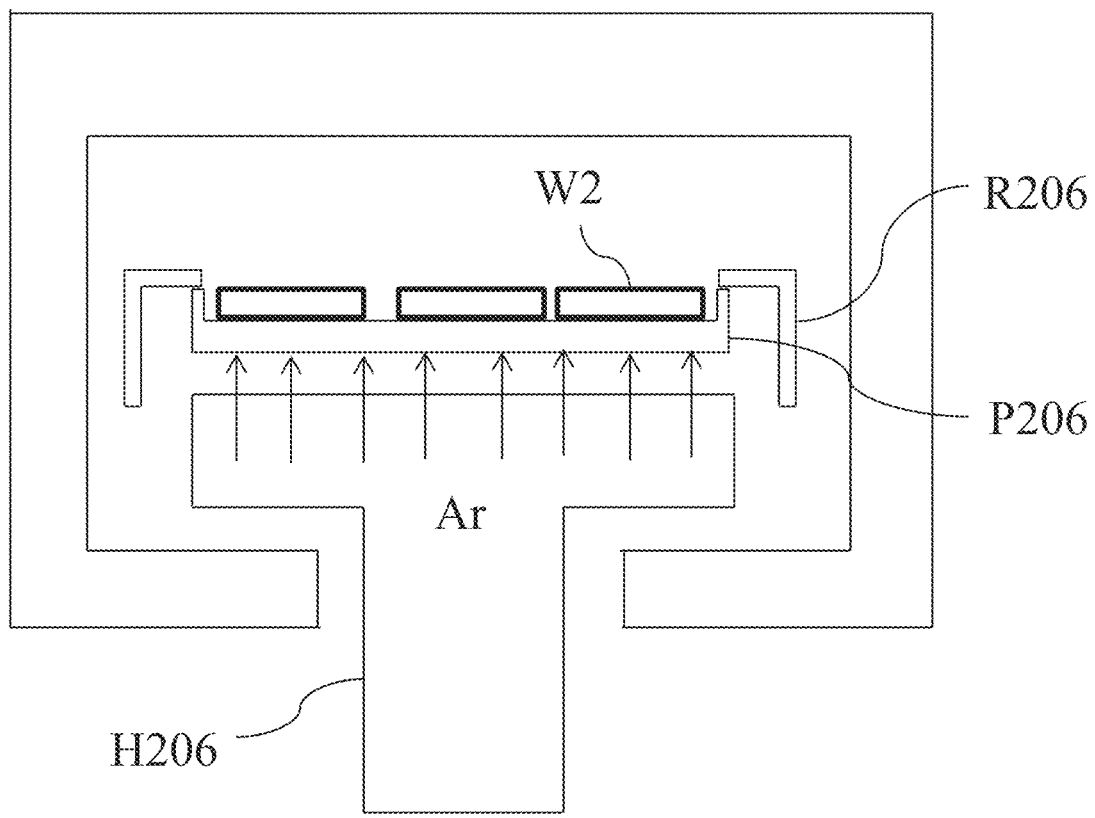
FIG. 4 is a schematic diagram showing a cooling chamber of a second type according to an embodiment of the present disclosure.

Further, the present disclosure provides a cooling chamber of another one type (i.e. a cooling chamber of a second type) which performs the first stage cooling on the aluminum nitride coated substrate therein. Refer to FIG. 4, and FIG. 4 is a schematic diagram showing a cooling chamber of a second type according to an embodiment of the present disclosure. As shown in FIG. 4, the cooling chamber 206B of the second type comprises a cooling base H206, a tray P206 and a clamp ring R206. The clamp ring R206 is used to fix the cooling base H206 and the tray P206. Interior of the cooling base H206 has flowing cooling water (not shown in the drawings), so as to cool down the cooling base H206. Then, the cooling base H206 provides gas to a back surface of the tray P206 to cool down the tray P206, wherein the gas can be inert gas, such as argon (Ar), helium (He) or nitrogen ($N_2$), and the present disclosure is not limited thereto. The tray P206 is used to support and contact at least one aluminum nitride coated substrate W2, and thus the cooled down tray 206 can perform the first stage cooling on the aluminum nitride coated substrate W2, wherein the number of the aluminum nitride coated substrates W2 supported by the tray P206 is not limited thereto. The cooling chamber 206B of the second type may comprises multiple sets of cooling bases H206, trays P206 and clamp rings R206 (not shown in the drawings), each of sets are arranged along the vertical direction, and the present disclosure is not limited thereto.

The first stage cooling performed by the cooling chamber of the second type in FIG. 4 is the contact cooling, wherein the gas flow of the gas which is provided to the back surface of the tray P206 from the cooling base H206 is 1-20 sccm, and the cooling water in the cooling base H206 has a temperature of −40 to 40° C. (preferably 30° C.). Similar to the cooling chamber of the first type, the cooling chamber of the second type provides a second vacuum environment to the aluminum nitride coated substrate W2 when performing the first stage cooling. When the cooling chamber of the second type perform the first stage cooling, a pressure in the cooling chamber of the first type (i.e. the pressure of the second vacuum environment) must not be larger than 50 mTorr, and a pressure between the tray P206 and the cooling base H206 is 1-10 Torr (preferably 3-5 Torr).

See Table 1, and it shows test conditions and results of cooling down the aluminum nitride coated substrate by using the cooling chamber of the second type. As shown in Table 1, the test conditions 1-4 have different cooling times of the first stage cooling, wherein status of the test condition 1 is similar to that of the conventional cooling, i.e. it does not have addition cooling chamber for cooling down the aluminum nitride coated substrate, and test conditions 2-4 of the cooling chamber of the second type have different cooling times for cooling down the aluminum nitride coated substrate. The measured values of the test results corresponding to test conditions 1-4 are temperatures of the tray, the center of the substrate and the edge of the substrate. As shown in Table 1, the longer the cooling time for cooling down the aluminum nitride coated substrate in the cooling chamber of the second type is, the lower the measured temperatures of the tray, the center of the substrate and the edge of the substrate are. That is, the longer the aluminum nitride coated substrate stayed in the cooling chamber of the second type is, the better the cooling effect is. Considering the cooling effect and the production capacity, the cooling time of 30-180 seconds is preferred, and the acceptable the production capacity and the good cooling effect of the first stage cooling can be obtained, wherein the cooling temperature of the cooling chamber of the second type is 150-250° C.

wherein the cooling load lock module 207 provides a third vacuum environment to the aluminum nitride coated substrate, the required vacuum degree should not be larger than 100 mTorr, and the cooling temperature of the cooling load lock module 207 for performing the second stage cooling should be less than 100° C. The pressure of the third vacuum environment is larger than that of the second vacuum environment.

Next, after the first stage cooling and the second stage cooling have been performed on the aluminum nitride coated substrate, the aluminum nitride coated substrate is finally transported to the load port module 201, and then back to the load box, such that the deposition of the aluminum nitride on the sapphire has been completed.

Next, the method for decreasing the generation of the surface oxide of the aluminum nitride, which can be applicable in the physical vapor deposition process, is illustrated as follows. Referring to FIG. 5, FIG. 5 a flow chart of a method for decreasing generation of surface oxide of aluminum nitride according to an embodiment of the present disclosure. Firstly, at step S501, in a vacuum environment, a substrate is transported to the deposition chamber, and the aluminum nitride is deposited on the substrate to form the aluminum nitride coated substrate. Next, at step S502, the aluminum nitride coated substrate is transported to a cooling chamber, and the cooling chamber performs a first stage cooling on the aluminum nitride coated substrate. Next, at step S503, the aluminum nitride coated substrate is transported to the cooling load lock module, and the cooling load lock module performs a second stage cooling on the aluminum nitride coated substrate. When step S503 has been finished, the deposition of the aluminum nitride on the substrate has been completed. By the way, the pressure of the second vacuum environment is preferably less than that of the third vacuum environment.

Finally, referring to FIG. 6, FIG. 6 is an X-ray diffraction analysis chart of crystals of the aluminum nitride according to an embodiment of the present disclosure. According to the X-ray diffraction analysis, it can be known that, by using the method and device for decreasing the surface oxide of the aluminum nitride, the crystal strength of the (002) direction of the deposited aluminum nitride is increased about 67% of that of the related art (p.s. the related art: 15000; and present disclosure: 2500). Further referring to FIG. 7, FIG. 7 is a schematic diagram showing two transmission microscope images of the deposition of the LED manufactured by using methods of the related art and the present disclosure, the

TABLE 1

| Test Condition | Cooling Time (second) of First Stage Cooling Performed by Cooling Chamber of Second Type | Cooling Time (second) of Second Stage Cooling Performed by Cooling Load Lock Module | Test Results | | |
|---|---|---|---|---|---|
| | | | Temperature (° C.) of Tray | Temperature (° C.) of Center of Substrate | Temperature (° C.) of Edge of Substrate |
| 1 | 0 | 10-40 | >200 | >200 | >200 |
| 2 | 40-70 | | <90 | <110 | <110 |
| 3 | 100-130 | | <70 | <90 | <90 |
| 4 | 550-630 | | <40 | <40 | <40 |

Next, refer to FIG. 2, after the first stage cooling is performed on the aluminum nitride coated substrate, the aluminum nitride coated substrate is transported to the cooling load lock module 207, and a second stage cooling is performed on the aluminum nitride coated substrate, aluminum nitride coated substrate in the related has a surface oxide thin film of aluminum nitride, which is about 6.6 nm, but by contrast, the aluminum nitride coated substrate in the present disclosure substantially has no surface oxide thin film of aluminum nitride. Therefore, the method and device provided by the present disclosure can completely prevent the generation of the surface oxide of the aluminum nitride.

Accordingly, compared to the related art, the advantages and technical results of the method and device for decreasing the generation of the surface oxide of the aluminum nitride are illustrated as follows.

In the related art, in the PVD process of manufacturing LED, after the aluminum nitride is deposited on the substrate, the aluminum nitride coated substrate is cooled down in the atmosphere environment, and the layer of the oxide is formed on the surface of the aluminum nitride, such that in the next process, the deposition effect and crystallinity of the gallium nitride are affected to be poor, and it causes several defects. By contrast, the method and device for decreasing the generation of the surface oxide of the aluminum nitride of the present disclosure perform a first stage cooling and a second stage cooling on the aluminum nitride coated substrate in different vacuum environments after the depositing the aluminum nitride, so as to efficiency decrease the generation of the surface oxide of the aluminum nitride, eliminate the defects of the gallium nitride in the next process, and enhance the LED product quality and performance.

The above descriptions merely illustrate exemplary embodiments of the present disclosure, and not used to limit the scope of the present disclosure. All equivalent variations and modifications on the basis of shapes, structures, features and spirits described in claims of the present disclosure should be included in the claims of the present disclosure.

What is claimed is:

1. A method for decreasing generation of surface oxide of aluminum nitride of LED substrate, used in a physical vapor deposition (PVD) process, comprising:
   step A, transmitting a substrate to a deposition chamber with a first vacuum environment, and depositing the aluminum nitride on the substrate to form an aluminum nitride coated substrate, wherein the substrate is a sapphire substrate;
   step B, transmitting the aluminum nitride coated substrate to a first cooling chamber with a second vacuum environment, and performing a first stage cooling on the aluminum nitride coated substrate; and
   step C, transmitting the aluminum nitride coated substrate that has performed the first stage cooling to a second cooling chamber with a third vacuum environment, and performing a second stage cooling on the aluminum nitride coated substrate for decreasing generation of surface oxide of the aluminum nitride coated substrate;
   wherein a pressure of the second vacuum environment is less than a pressure of the third vacuum environment.

2. The method for decreasing the generation of the surface oxide of the aluminum nitride of LED substrate according to claim 1, wherein in step B, the first stage cooling comprises at least one of a contact cooling, a quiescence cooling and a gas cooling.

3. The method for decreasing the generation of the surface oxide of the aluminum nitride of LED substrate according to claim 2, wherein when the first stage cooling comprises the gas cooling, gas for cooling is inert gas.

4. The method for decreasing the generation of the surface oxide of the aluminum nitride of LED substrate according to claim 1, wherein in step B, the first cooling chamber for performing the first stage cooling on the aluminum nitride coated substrate has a cooling temperature of 150-250° C.

5. The method for decreasing the generation of the surface oxide of the aluminum nitride of LED substrate according to claim 1, wherein in step C, the second cooling chamber for performing the second stage cooling on the aluminum nitride coated substrate has a cooling temperature being less than 100° C.

* * * * *